(12) United States Patent
Bhattacharyya et al.

(10) Patent No.: US 6,236,590 B1
(45) Date of Patent: May 22, 2001

(54) OPTIMAL WRITE CONDUCTORS LAYOUT FOR IMPROVED PERFORMANCE IN MRAM

(75) Inventors: Manoj Bhattacharyya, Cupertino; Thomas Anthony, Sunnyvale, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/624,134

(22) Filed: Jul. 21, 2000

(51) Int. Cl.$^7$ ..................................................... G11C 11/15
(52) U.S. Cl. .......................... 365/173; 365/171; 365/158
(58) Field of Search .................... 365/173, 171, 365/158, 66, 55, 8, 87

(56) References Cited

U.S. PATENT DOCUMENTS

| | | |
|---|---|---|
| 5,732,016 | 3/1998 | Chen et al. ............................ 365/158 |
| 5,838,608 | 11/1998 | Zhu et al. .............................. 365/158 |
| 5,949,707 * | 9/1999 | Pohm et al. ........................... 365/158 |
| 5,956,267 | 9/1999 | Hurst et al. ............................ 365/158 |
| 5,982,658 | 11/1999 | Berg et al. ............................. 365/158 |
| 5,982,660 | 11/1999 | Bhattacharyya et al. ............ 365/173 |
| 6,005,800 | 12/1999 | Koch et al. ............................ 365/173 |
| 6,072,717 | 6/2000 | Brug et al. ............................. 365/171 |

OTHER PUBLICATIONS

Mark Johnson, "Magnetoelectronic Memories Last and Last . . . ", IEEE Spectrum–Feb. 2000–pp. 33–40.

* cited by examiner

Primary Examiner—David Nelms
Assistant Examiner—David Lam
(74) Attorney, Agent, or Firm—Trueman H. Denny, III

(57) ABSTRACT

An optimal write conductor layout structure for improved MRAM performance is disclosed. A write conductor layout structure for a magnetic memory cell includes a data storage layer having a first layer width in a first direction and a second layer width in a second direction. The data storage layer is positioned between a first conductor having a first width in the first direction and a second conductor having a second width in the second direction. The first and second conductors cross the data storage layer in the first and second directions respectively. The first width of the first conductor is less than the first layer width of the data storage layer and the first width of the first conductor is positioned so that the first layer width overlaps the entirety of the first width of the first conductor. The second width of the second conductor is less than the second layer width of the data storage layer and the second width of the second conductor is positioned so that the second layer width overlaps the entirety of the second width of the second conductor. The narrow widths of the first and second conductors eliminates misalignment between the conductors and the data storage layer, reduces leakage of a write magnetic field generated by currents applied to the first and second conductors, and can generate the write magnetic field with less current thereby reducing power consumption in the memory cell.

24 Claims, 10 Drawing Sheets

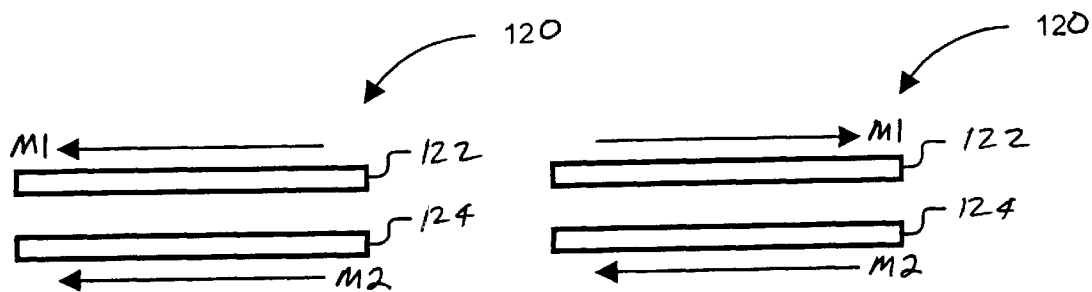
FIG. 2b
(Prior Art)
FIG. 2c
(Prior Art)
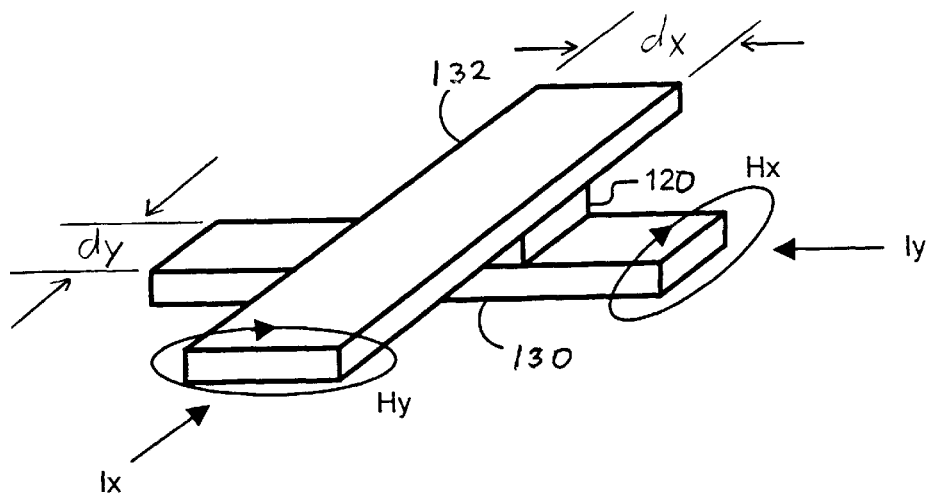
FIG. 3
(Prior Art)

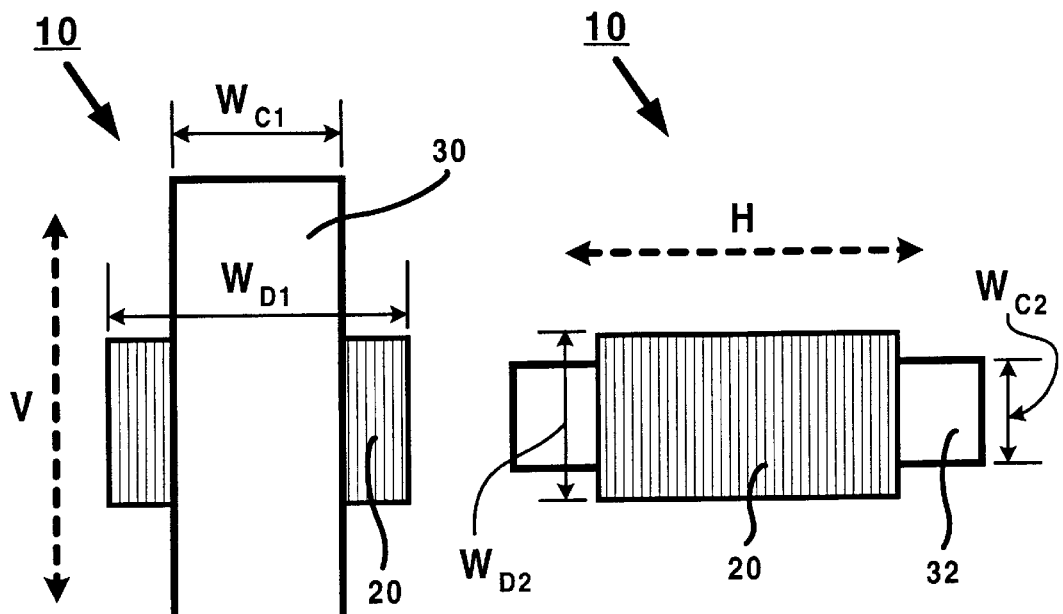
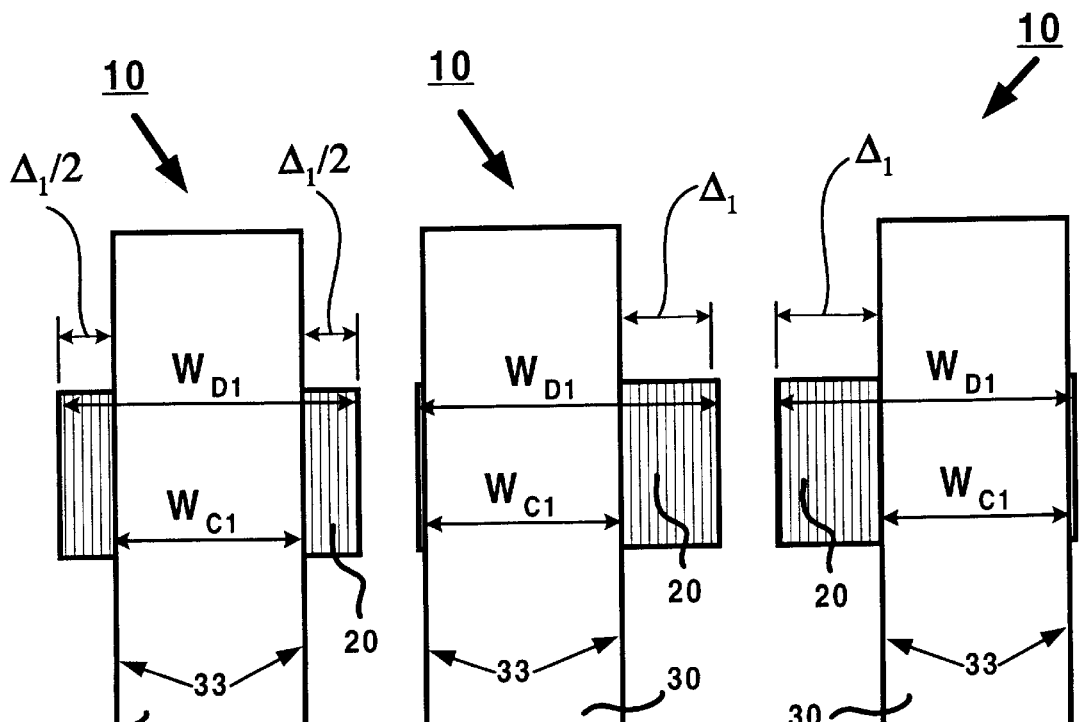

OPTIMAL WRITE CONDUCTORS LAYOUT FOR IMPROVED PERFORMANCE IN MRAM

BACKGROUND OF THE INVENTION

The present invention relates generally to an optimal write conductor layout in a magnetic random access memory (MRAM). More specifically, the present invention relates to a write conductor layout wherein a width of a write conductor is made less than a width of a data storage layer and the width of the write conductor is contained entirely within the width of the data storage layer.

BACKGROUND ART

A typical MRAM device includes an array of memory cells. Word lines extend along rows of the memory cells, and bit lines extend along columns of the memory cells. Located at a cross point of a word line and a bit line, each memory cell stores a bit of information as an orientation of a magnetization. The orientation of magnetization of each memory cell will assume one of two stable orientations at any given time. These two stable orientations, parallel and anti-parallel, represent logic values of "1" and "0" The orientation of magnetization of a selected memory cell may be changed by supplying current to a word line and a bit line crossing the selected memory cell. The currents create magnetic fields that, when combined, can switch the orientation of magnetization of the selected memory cell from parallel to anti-parallel or vice versa. Because the word line and the bit line operate in combination to switch the orientation of magnetization of the selected memory cell (i.e. to write the memory cell), the word line and the bit line can be collectively referred to as write lines. Additionally, the write lines can also be used to read the logic value stored in the memory cell.

FIG. 1 illustrates a top plan view of a simplified prior art MRAM array 100. The array 100 includes word lines 130, bit lines 132, and memory cells 120. The memory cells 120 are positioned at each intersection of a word line 130 with a bit line 132. In many MRAM designs, the write lines (130, 132) are made the same width as the memory cell 120 as shown by a width dx for the bit lines 132 and a width dy for the word lines 130. Consequently, the memory cells 120 have rectangular dimensions dx and dy that are defined by the widths of the write lines (130, 132). Typically, the write lines (130, 132) are arranged in orthogonal relation to one another and the memory cells 120 are positioned in between the write lines (130, 132), as illustrated in FIG. 1b. For example, the bit lines 132 can be positioned above the memory cells 120 and the word lines 130 can be positioned below.

FIGS. 2a through 2c illustrate the storage of a bit of data in a single memory cell 120. In FIG. 2a, the memory cell 120 includes an active magnetic data film 122 and a pinned magnetic film 124 which are separated by a dielectric region 126. The orientation of magnetization in the active magnetic data film 122 is non-fixed and can assume two stable orientations as shown by arrow $M_1$. On the other hand, the pinned magnetic film 124 has a fixed orientation of magnetization as shown by arrow $M_2$. The active magnetic data film 122 rotates its orientation of magnetization in response to electrical currents applied to the write lines (130, 132, not shown) during a write operation to the memory cell 120. A first logic state of the data bit stored in the memory cell 120 is indicated when $M_1$ and $M_2$ are parallel to each other as illustrated in FIG. 2b. For instance, when $M_1$ and $M_2$ are parallel a logic "1" state is stored in the memory cell 120. Conversely, a second logic state is indicated when $M_1$ and $M_2$ are anti-parallel to each other as illustrated in FIG. 2c. Similarly, when $M_1$ and $M_2$ are anti-parallel a logic "0" state is stored in the memory cell 120. In FIGS. 2b and 2c the dielectric region 126 has been omitted. Although FIGS. 2a through 2c illustrate the active magnetic data film 122 positioned above the pinned magnetic film 124, the pinned magnetic film 124 can be positioned above the active magnetic data film 122.

The resistance of the memory cell 120 differs according to the orientations of $M_1$ and $M_2$. When $M_1$ and $M_2$ are anti-parallel, i.e. the logic "0" state, the resistance of the memory cell 120 is at it highest. On the other hand, the resistance of the memory cell 120 is at its lowest when the orientations of $M_1$ and $M_2$ are parallel, i.e. the logic "1" state. As a consequence, the logic state of the data bit stored in the memory cell 120 can be determined by measuring it resistance. The resistance of the memory cell 120 is reflected by a magnitude of a sense current 123 (referring to FIG. 2a) that flows in response to read voltages applied to the write lines (130, 132).

In FIG. 3, the memory cell 120 is positioned between the write lines (130, 132). The active and pinned magnetic films (122, 124) are not shown in FIG. 3. The orientation of magnetization of the active magnetic data film 122 is rotated in response to a current $I_x$ that generates a magnetic field $H_y$ and a current $I_y$ that generates a magnetic field $H_x$. The magnetic fields $H_x$ and $H_y$ act in combination to rotate the orientation of magnetization of the memory cell 120. In FIG. 3, the write lines (130, 132) are shown having the same widths (dx and dy) as the memory cell 120 as previously mentioned in reference to FIGS. 1a and 1b.

Ideally, both of the write lines (130, 132) should have widths (dx and dy) that are identical to their corresponding widths (dx and dy) on the memory cell 120. Accordingly, the bit line 132 should have a width $W_{CV}$ in a vertical direction Y that is equal in width to a width $W_{DV}$ in the vertical direction Y of the memory cell 120 as illustrated in FIG. 4a. Similarly, the word line 130 should have a width $W_{CH}$ in a horizontal direction X that is equal in width to a width $W_{DH}$ in the horizontal direction X of the memory cell 120 as illustrated in FIG. 5a.

However, due to misalignment between the write lines (130, 132) and the memory cells 120 of the array 100 (see FIGS. 1a and 1b), the word lines 130 and the bit lines 132 can be offset from the memory cells 120. The misalignment can be caused by lithographic alignment inaccuracies that are inherent to the lithographic processes that are used to fabricate an MRAM device. In FIG. 4b, the bit line 132 is offset from the memory cell 120 by an offset δ. Similarly, in FIG. 5b, the word line 130 is offset from the memory cell 120 by an offset δ. The value of δ will depend on the lithographic process used to fabricate the MRAM device. For instance, a state-of-the-art value of δ can be on the order of 0.05 μm. That value for δ can be quite substantial for sub-micron size memory cells.

One disadvantage of the offset δ is a reduced magnetic field in those portions of the memory cell 120 that are not covered by the write lines (130, 132) as shown by dashed lines 141 and 145 that encircle an exposed edge of the memory cell 120 in FIGS. 4b and 5b respectively. As a result, the combined magnetic fields from the write lines (130, 132) may not rotate the orientation of magnetization $M_1$ from a parallel orientation to an anti-parallel orientation or vice-versa during a write operation that selects the memory cell 120.

Another disadvantage of the offset δ is that a portion of the write lines (130, 132) is positioned outside the width of the memory cell 120 as shown by cross-hatched regions 143 and 147 in FIGS. 4b and 5b respectively. Consequently, the magnetic field generated by those portions is mainly wasted and cannot contribute to rotating the orientation of magnetization $M_1$. Additionally, in extreme cases, the portion of the magnetic field produced by the double-hatched regions 143 and 147 can interfere with unselected bits of neighboring memory cells (not shown) thus causing data corruption of already written information in those neighboring memory cells.

Moreover, the magnitude of the currents $I_x$ and $I_y$ that generate the magnetic fields $H_y$ and $H_x$ respectively, are insufficient to write the memory cell 120 because a portion of the magnetic fields $H_y$ and $H_x$ is wasted. In most high density MRAM designs, current and magnetic fields are very precious objects and every attempt should be made to make efficient use of the write currents $I_x$ and $I_y$, to lower power consumption, and to efficiently couple the magnetic fields $H_y$ and $H_x$ with the active magnetic data film 122.

Therefore, there is a need for a layout structure for current carrying conductors in a MRAM memory that eliminates misalignment between a data storage layer of a MRAM memory cell and the write lines that cross the data storage layer.

There is also a need for write lines that are contained within the width of the data storage layer so that the magnetic fields generated by the write lines are not wasted and are efficiently coupled with the data storage layer.

Additionally, there is a need to reduce power consumption in the MRAM memory cell by reducing the magnitude of the write currents necessary to rotate the orientation of magnetization of the data storage layer during write operations to the memory cell. For example, reduced power can result in a reduction in waste heat generated by an electronic device incorporating the MRAM memory. Moreover, for portable devices, it is desirable to reduce power consumption in order to extend battery life.

SUMMARY OF THE INVENTION

The above mentioned needs are met by the write conductor layout structure of the present invention. Misalignment between the write lines (i.e. a word line or a bit line) and the data storage layer is addressed by making the width of a write line narrower than the width of the data storage layer that is crossed by the write line. Additionally, the write line is positioned so that its width is entirely contained within the width of the data storage layer. The problems associated with leakage of the magnetic field, wasted magnetic field, and reduced coupling of the magnetic field with the data storage layer are also solved by the narrowed width of the write line and the position of the write line within the width of the data storage layer. Moreover, the narrowed width of the write line can produce a magnetic field of greater magnitude for a given current or the magnitude of the magnetic field necessary to rotate the orientation of magnetization of the data storage layer can be produced by a reduced magnitude of current thereby reducing power consumption.

Broadly, the present invention is embodied in a write conductor layout structure for a magnetic memory cell that includes a data storage layer having a first layer width in a first direction and a second layer width in a second direction. The data storage layer is positioned between a first conductor having a first width in the first direction and a second conductor having a second width in the second direction. The first and second conductors cross the data storage layer in the first and second directions respectively. The first width of the first conductor is less than the first layer width of the data storage layer and the first width of the first conductor is positioned so that the first layer width overlaps the entirety of the first width of the first conductor. Similarly, the second width of the second conductor is less than the second layer width of the data storage layer and the second width of the second conductor is positioned so that the second layer width overlaps the entirety of the second width of the second conductor. Moreover, the first conductor, the second conductor, or both the first and second conductors may be made less in width than their respective first and second layer widths.

In one embodiment of the present invention, the first and second widths can be selected to be less than their respective first and second layer widths by a process alignment offset. The process alignment offset can be based on an alignment tolerance of a lithographic process used in fabricating the MRAM device.

In another embodiment of the present invention, either one of the first and second conductors can be centered within its corresponding layer width, left-shifted within its corresponding layer width, or right-shifted within its corresponding layer width.

In one embodiment of the present invention, the first and second conductors can be the word line or the bit line (the write lines) of a MRAM device.

In another embodiment of the present invention, a magnitude of a first portion of a write magnetic field generated by a current applied to the first conductor is greater than when the first width is at least equal to the first layer width.

In one embodiment of the present invention, a magnitude of a second portion of a write magnetic field generated by a current applied to the second conductor is greater than when the second width is at least equal to the second layer width.

In another embodiment of the present invention, the position of the first width operatively couples a first portion of a write magnetic field with the data storage layer so that a magnitude of a current applied to the first conductor is less than when the first width is at least equal to the first layer width.

In yet another embodiment of the present invention, the position of the second width operatively couples a second portion of a write magnetic field with the data storage layer so that a magnitude of a current applied to the second conductor is less than when the second width is at least equal to the second layer width.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 2a through 2c are profile and side views of a prior art MRAM memory cell illustrating an orientation of magnetization of active and reference magnetic films.

FIG. 3 is a profile view of a prior art memory cell, its write lines, and magnetic fields generated by currents flowing in the write lines.

FIGS. 6 and 7 are top plan views of a write conductor layout structure according to the present invention.

FIGS. 8a through 8c are top plan views illustrating centered, left-shifted, and right-shifted vertical write conductor layout structures according to the present invention.

DETAILED DESCRIPTION

Figure 1A:
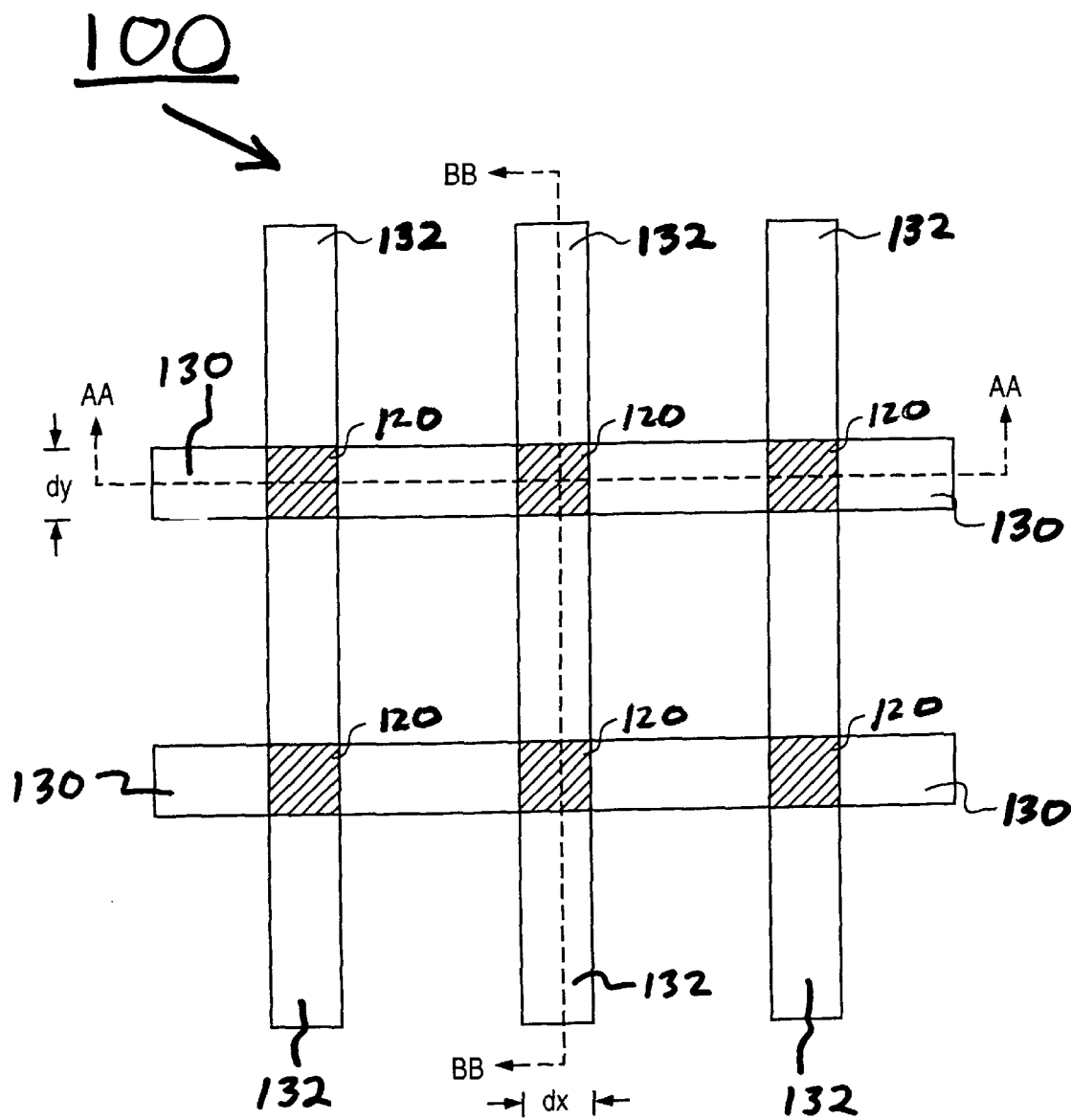
FIGS. 1a and 1b are top and profile views of a prior art MRAM array.
Figure 1B:
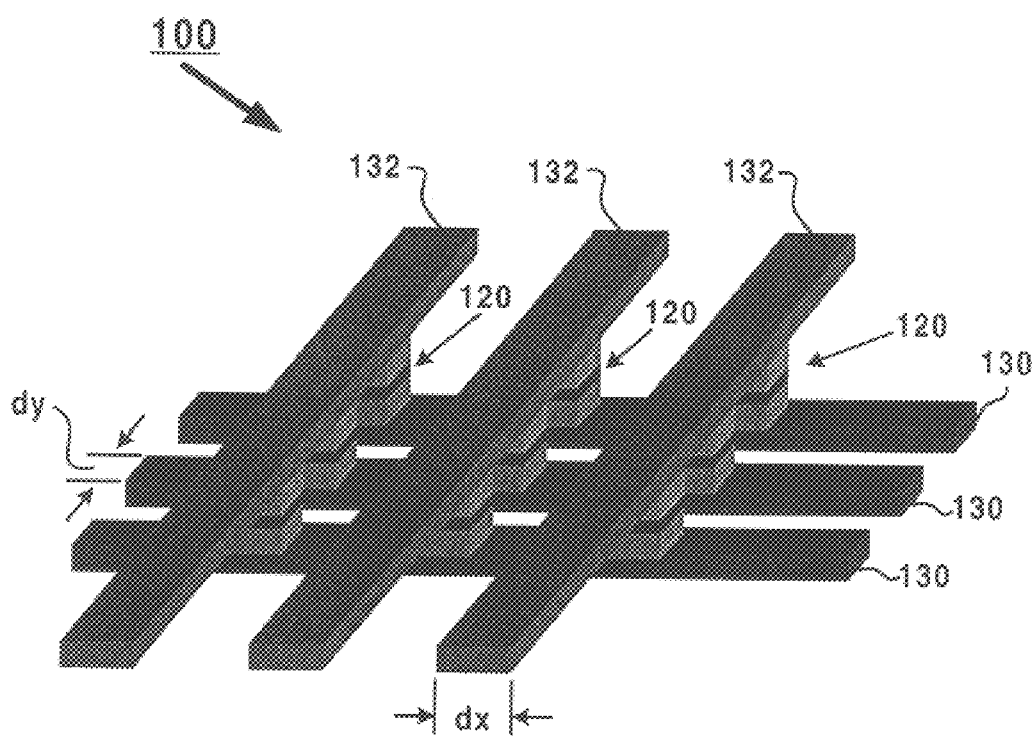
Figure 2A:
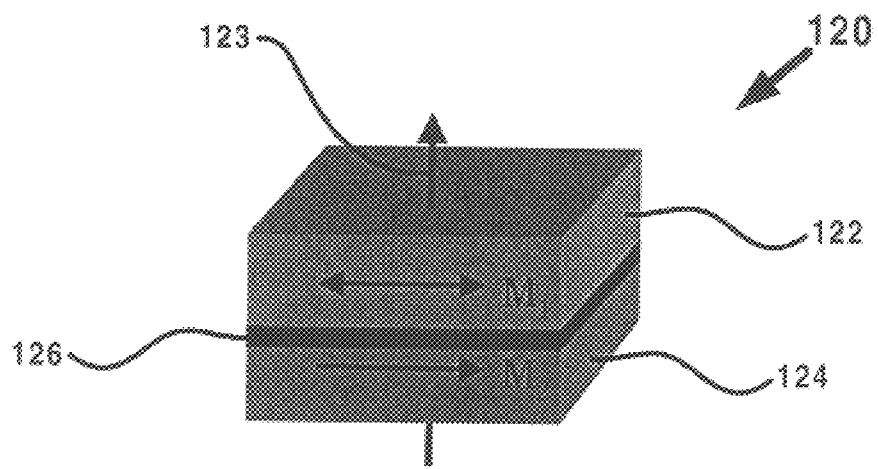

In the following detailed description and in the several figures of the drawings, like elements are identified with like reference numerals.

As shown in the drawings for purpose of illustration, the present invention is embodied in a write conductor layout structure for a magnetic memory cell. The write conductor layout structure includes a first conductor having a first width and a second conductor having a second width. A data storage layer is positioned between the first and second conductors and the data storage layer includes a first layer width in a first direction and a second layer width in a second direction. The first and second conductors cross the data storage layer in substantially the first and second directions respectively. The first width of the first conductor is preselected to be less than the first layer width and the first width is positioned relative to the first layer width so that the first layer width overlaps the entirety of the first width. The second width of the second conductor is preselected to be less than the second layer width and the second width is positioned relative to the second layer width so that the second layer width overlaps the entirety of the second width.

Advantages of the first and second widths being narrower than the first and second layer widths include but are not limited to: improved coupling of a write magnetic field with the data storage layer so that the write magnetic field is not wasted or reduced to due to misalignment between the data storage layer and the first and/or the second conductor; the first and/or the second widths are contained within their respective layer widths so that the aforementioned misalignment is eliminated; a leakage magnetic field that can interfere with nearby memory cells is reduced or eliminated by positioning the first and second widths within their respective layer widths; the narrowed width of the first and/or the second conductor can produce a magnetic field of greater magnitude for a given current; and the narrowed width of the first and/or the second conductor can generate the magnetic field necessary to rotate the orientation of magnetization of the data storage layer with a reduced magnitude of current thereby reducing power consumption.

In FIGS. 6 and 7, a write conductor layout structure 10 for a magnetic memory cell includes a first conductor 30 having a first width $W_{C1}$ (see FIG. 6) and a second conductor 32 having a second width $W_{C2}$ (see FIG. 7). A data storage layer 20 is operatively positioned between the first conductor 30 and the second conductor 32 (not shown) so that a write magnetic field (not shown) generated by both of the first and second conductors (30, 32) results in rotation of an orientation of magnetization of an active layer (not shown) of the data storage layer 20. Currents applied to the first and second conductors (30, 32) generate the write magnetic field during a write operation. The data storage layer 20 includes a first layer width $W_{D1}$ in a first direction indicated by a dashed arrow V and a second layer width $W_{D2}$ in a second direction indicated by a dashed arrow H. The first and second conductors (30, 32) cross the data storage layer 20 in substantially the first and second directions (V, H) respectively.

The first width $W_{C1}$ of the first conductor 30 is preselected to be less than the first layer width $W_{D1}$ and the second width $W_{C2}$ of the second conductor 32 is preselected to be less than the second layer width $W_{D2}$. The first width $W_{C1}$ is positioned relative to the first layer width $W_{D1}$ so that the first layer width $W_{D1}$ overlaps the entirety of the first width $W_{C1}$ as illustrated in FIG. 6. The second width $W_{C2}$ is positioned relative to the second layer width $W_{D2}$ so that the second layer width $W_{D2}$ overlaps the entirety of the second width $W_{C2}$ as illustrated in FIG. 7.

For purposes of illustration, the first conductor 30 is positioned above the data storage layer 20 (see FIG. 6) and the second conductor 32 is positioned below the data storage layer 20 (see FIG. 7). However, the positions of the first and second conductors (30, 32) can be reversed. Additionally, the positions of the first and second conductors (30, 32) in relationship to the data storage layer 20 are illustrated separately in FIGS. 6 and 7 for purposes of clarity; however, the first and second conductors (30, 32) cross the data storage layer 20 as will be described below in reference to FIGS. 10a through 10c.

Although FIGS. 6 and 7 illustrate the first conductor 30 with a vertical orientation in the first direction V and the second conductor 32 with a horizontal orientation in the second direction H, the above mentioned advantages to the write conductor layout structure of the present invention apply when the aforementioned vertical and horizontal orientations are reversed, i.e. the first conductor 30 can have a horizontal orientation and the second conductor 32 can have a vertical orientation. Moreover, the write conductor layout structure 10 of the present invention is not limited to horizontal and vertical conductor orientations, orientations other than horizontal and vertical are embraced by the principles of the present invention.

The data storage layer 20 can be a magnetoelectric device that includes but is not limited to a spin dependent tunneling device, a spin valve device, and a giant magnetoresistive device. Although the data storage layer 20 is illustrated herein as having a rectangular shape, the data storage layer 20 can have a shape that includes but is not limited to a rectangular shape, an arcuate shape, and a polygon shape.

Figure 13A:
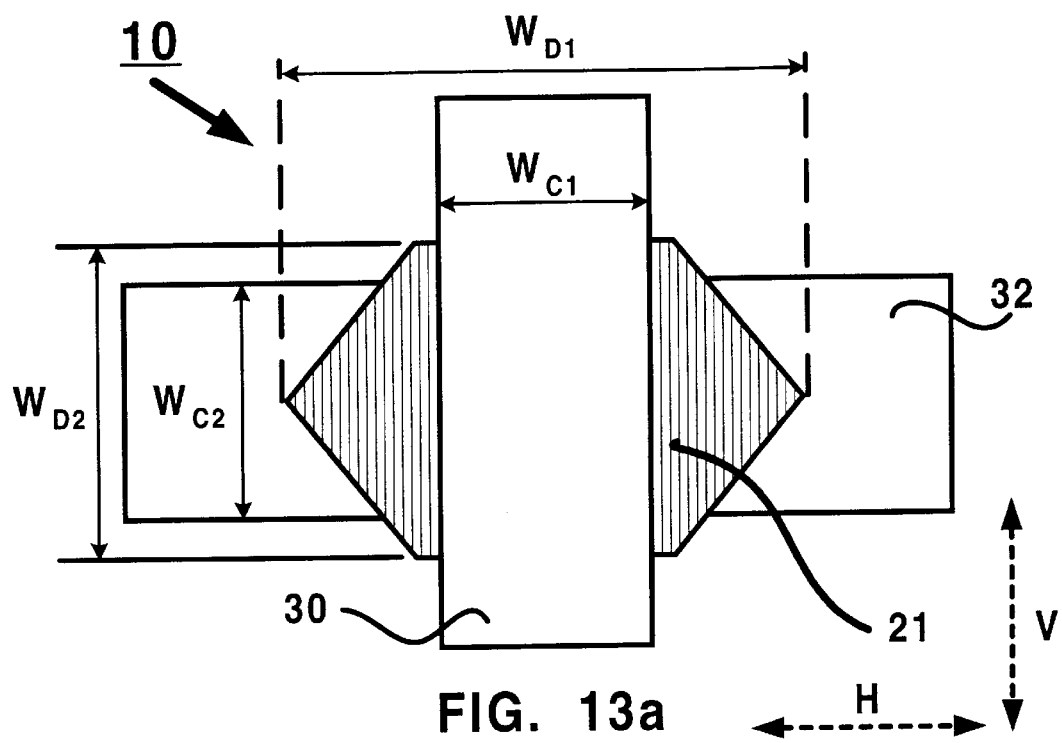
FIGS. 13a and 13b are top plan views of data storage layers having a polygon shape and an arcuate shape respectively and crossed by write conductors according to the present invention.
Figure 13B:
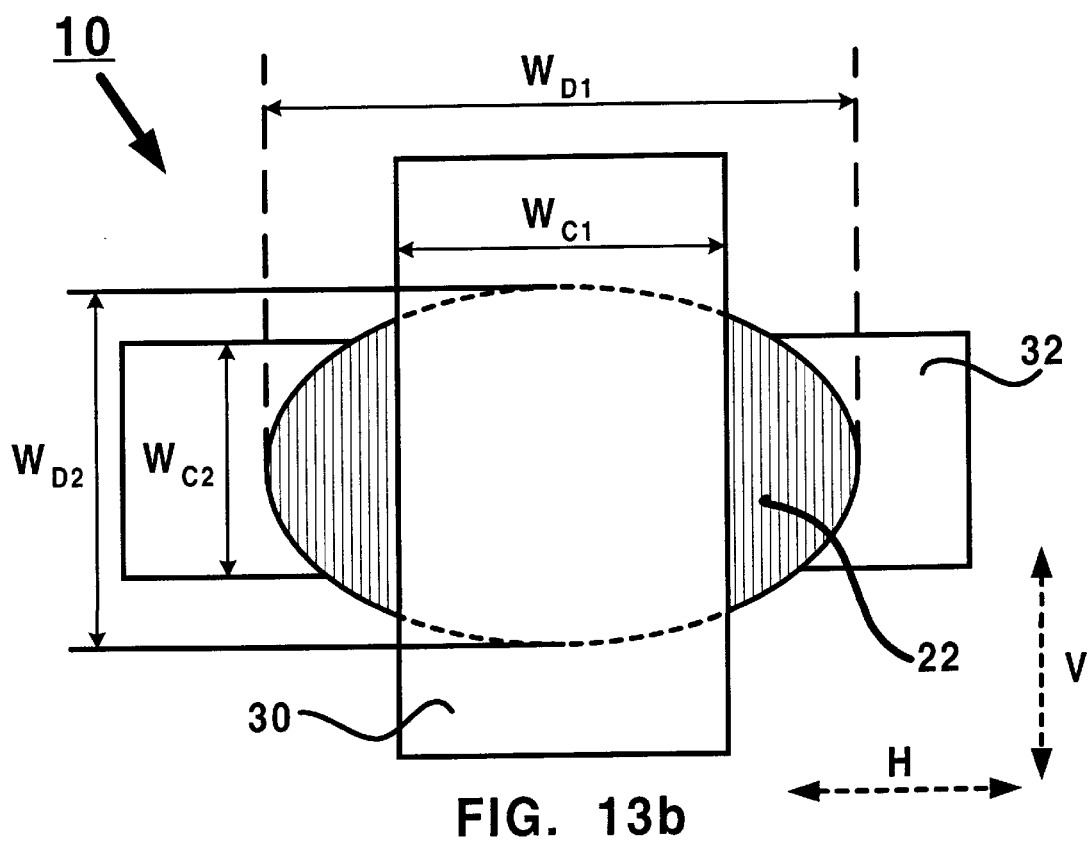

FIGS. 13a and 13b illustrate a polygon shaped data storage layer 21 and a arcuate shaped data storage layer 22 respectively. It should be noted that in FIGS. 13a and 13b, the first and second conductors (30, 32) cross their respective data storage layers in the first and second directions (V, H) and the first layer width $W_{D1}$ and the second layer width $W_{D2}$ are the maximum widths of the data storage layers in the first and second directions (V, H) respectively. For instance, in FIG. 13a, the first layer width $W_{D1}$ is the maximum width of the data storage layer 21 in the first direction V and the first width $W_{C1}$ is positioned relative to the first layer width $W_{D1}$ so that the first layer width $W_{D1}$ overlaps the entirety of the first width $W_{C1}$. Similarly, the second layer width $W_{D2}$ is the maximum width of the data storage layer 21 in the second direction H and the second width $W_{C2}$ is positioned relative to the second layer width $W_{D2}$ so that the second layer width $W_{D2}$ overlaps the entirety of the second width $W_{C2}$.

In one embodiment of the present invention, as illustrated in FIGS. 8a through 8c, the first width $W_{C1}$ of the first conductor 30 is preselected to be less than the first layer width $W_{D1}$ of the data storage layer 20 in the first direction V by a first process alignment offset $\Delta_1$. The first process alignment offset $\Delta_1$ can be a value determined by an alignment tolerance of a lithographic process used to fabricate an MRAM device incorporating the write conductor layout structure 10. For instance, if the alignment tolerance is 0.05 μm, then the first width $W_{C1}$ can be less than the first layer width $W_{D1}$ by $\Delta_1 = 0.05$ μm or by some fraction or percentage of $\Delta_1$. For example, if $\Delta_1 = 0.05$ μm then the first width $W_{C1}$ can be less than the first layer width $W_{D1}$ by 80% of $\Delta_1$ (0.8*0.05 μm=0.04 μm); therefore the first width $W_{C1}$ is 0.04 μm less in width than the first layer width $W_{D1}$. On the other hand, if $\Delta_1 = 0.05$ μm then the first width $W_{C1}$ can be less than the first layer width $W_{D1}$ by 1¼ (i.e. 1.25) of $\Delta_1$ (1.25*0.05 μm=0.06275 μm); therefore the first width $W_{C1}$ is 0.06275 μm less in width than the first layer width $W_{D1}$. In either case, the first width $W_{C1}$ is narrower than the first layer width $W_{D1}$ and the first layer width $W_{D1}$ overlaps in its entirety the first width $W_{C1}$. The above examples also apply to $\Delta_2$, the second layer width $W_{D2}$, and the second width $W_{C2}$.

The first width $W_{C1}$ can have a substantially centered position within the first layer width $W_{D1}$ as illustrated in FIG. 8a. In FIG. 8a, opposed edges 33 of the first conductor 30 are positioned inward of the first layer width $W_{D1}$ by a distance equal to the first process alignment offset $\Delta_1 \div 2$ so that the first width $W_{C1}$ has a substantially centered position within the first layer width $W_{D1}$ and the first layer width $W_{D1}$ overlaps the entirety of the first width $W_{C1}$. In FIG. 8b, the first width $W_{C1}$ has a position within the first layer width WD1 that is left-shifted by a distance equal to the first process alignment offset $\Delta_1$; however, the first layer width $W_{D1}$ overlaps the entirety of the first width $W_{C1}$. Similarly, in FIG. 8c, the first width $W_{C1}$ has a position within the first layer width $W_{D1}$ that is right-shifted by a distance equal to the first process alignment offset $\Delta_1$; however, the first layer width $W_{D1}$ overlaps the entirety of the first width $W_{C1}$. The first width $W_{C1}$ can be left-shifted or right-shifted by a fraction or a percentage of the first process alignment offset $\Delta_1$.

Figure 9A:
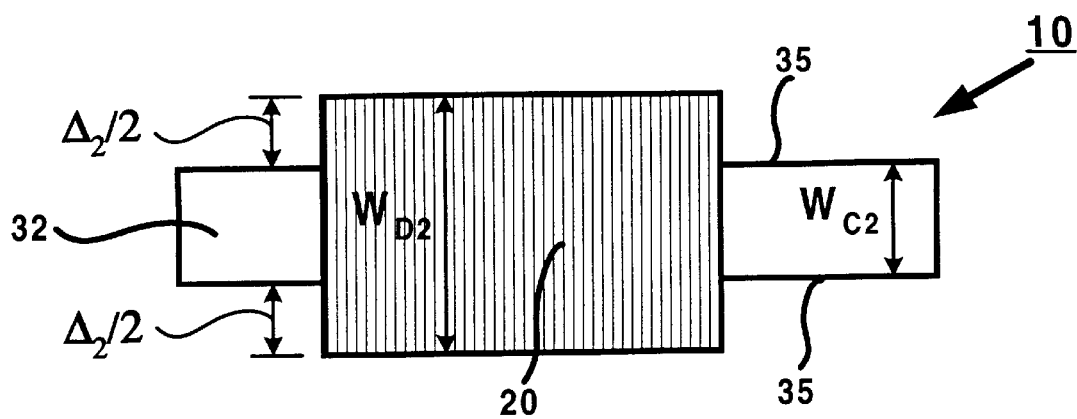
FIGS. 9a through 9c are top plan views illustrating centered, up-shifted, and down-shifted horizontal write conductor layout structures according to the present invention.
Figure 9B:
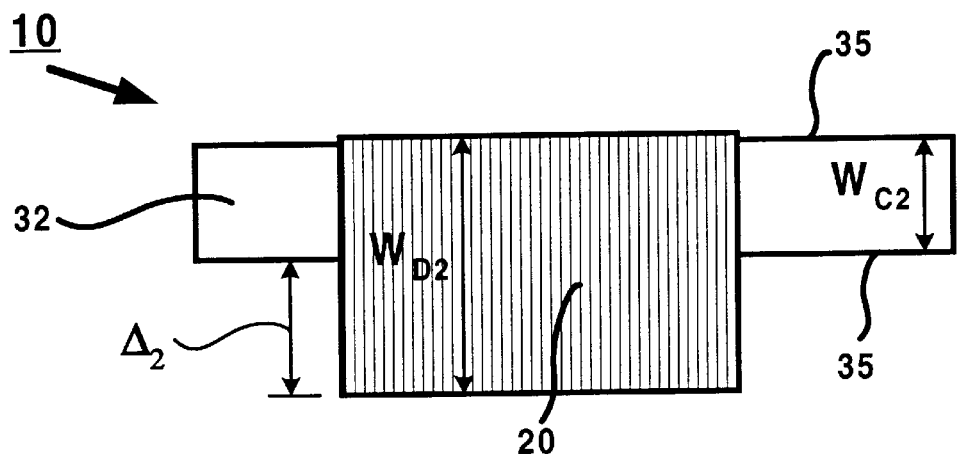
Figure 9C:
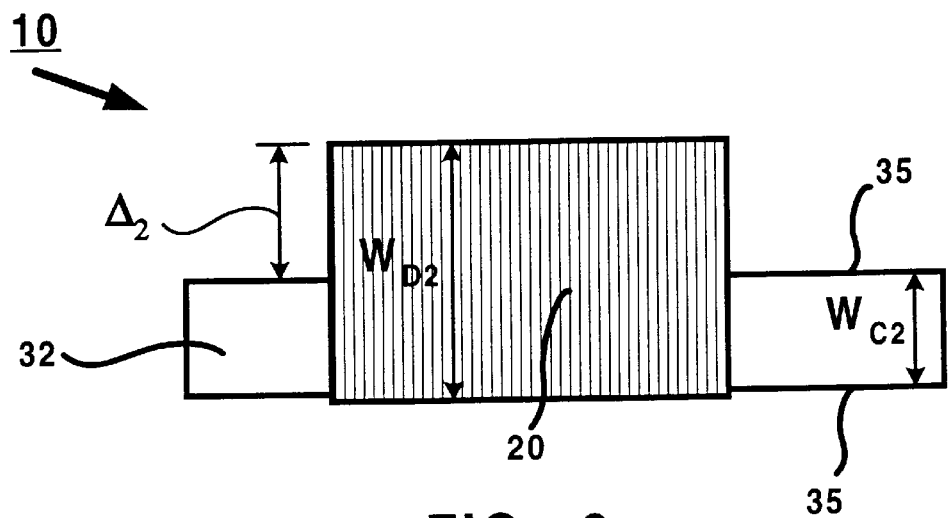

In another embodiment of the present invention, as illustrated in FIGS. 9a through 9c, the second width $W_{C2}$ of the second conductor 32 is preselected to be less than the second layer width $W_{D2}$ of the data storage layer 20 in the second direction H by a second process alignment offset $\Delta_2$. The second process alignment offset $\Delta_2$ can be a value determined by an alignment tolerance of a lithographic process used to fabricate an MRAM device incorporating the write conductor layout structure 10. For instance, if the alignment tolerance is 0.07 μm, then the second width $W_{C2}$ can be less than the second layer width $W_{D2}$ by $\Delta_2 = 0.07$ μm or by some fraction or percentage of $\Delta_2$. The second width $W_{C2}$ can have a substantially centered position within the first layer width $W_{D2}$ as illustrated in FIG. 9a. In FIG. 9a, opposed edges 35 of the second conductor 32 are positioned inward of the second layer width $W_{D2}$ by a distance equal to the second process alignment offset $\Delta_2 \div 2$ so that the second width $W_{C2}$ has a substantially centered position within the second layer width $W_{D2}$ and the second layer width $W_{D2}$ overlaps the entirety of the second width $W_{C2}$. In FIG. 9b, the second width $W_{C2}$ has a position within the second layer width $W_{D2}$ that is left-shifted (herein shown as being up-shifted) by a distance equal to the second process alignment offset $\Delta_2$; however, the second layer width $W_{D2}$ overlaps the entirety of the second width $W_{C2}$. Similarly, in FIG. 9c, the second width $W_{C2}$ has a position within the second layer width $W_{D2}$ that is right-shifted (herein shown as being down-shifted) by a distance equal to the second process alignment offset $\Delta_2$; however, the second layer width $W_{D2}$ overlaps the entirety of the second width $W_{C2}$. The second width $W_{C2}$ can be left-shifted or right-shifted by a fraction or a percentage of the second process alignment offset $\Delta_2$.

In one embodiment of the present invention, the first process alignment offset $\Delta_1$ and the second process alignment offset $\Delta_2$ are in a range from about 0.01 μm to about 0.08 μm. In yet another embodiment of the present invention, the first process alignment offset $\Delta_1$ and the second process alignment offset $\Delta_2$ are equal to each other ($\Delta_1 = \Delta_2$).

Figure 10A:
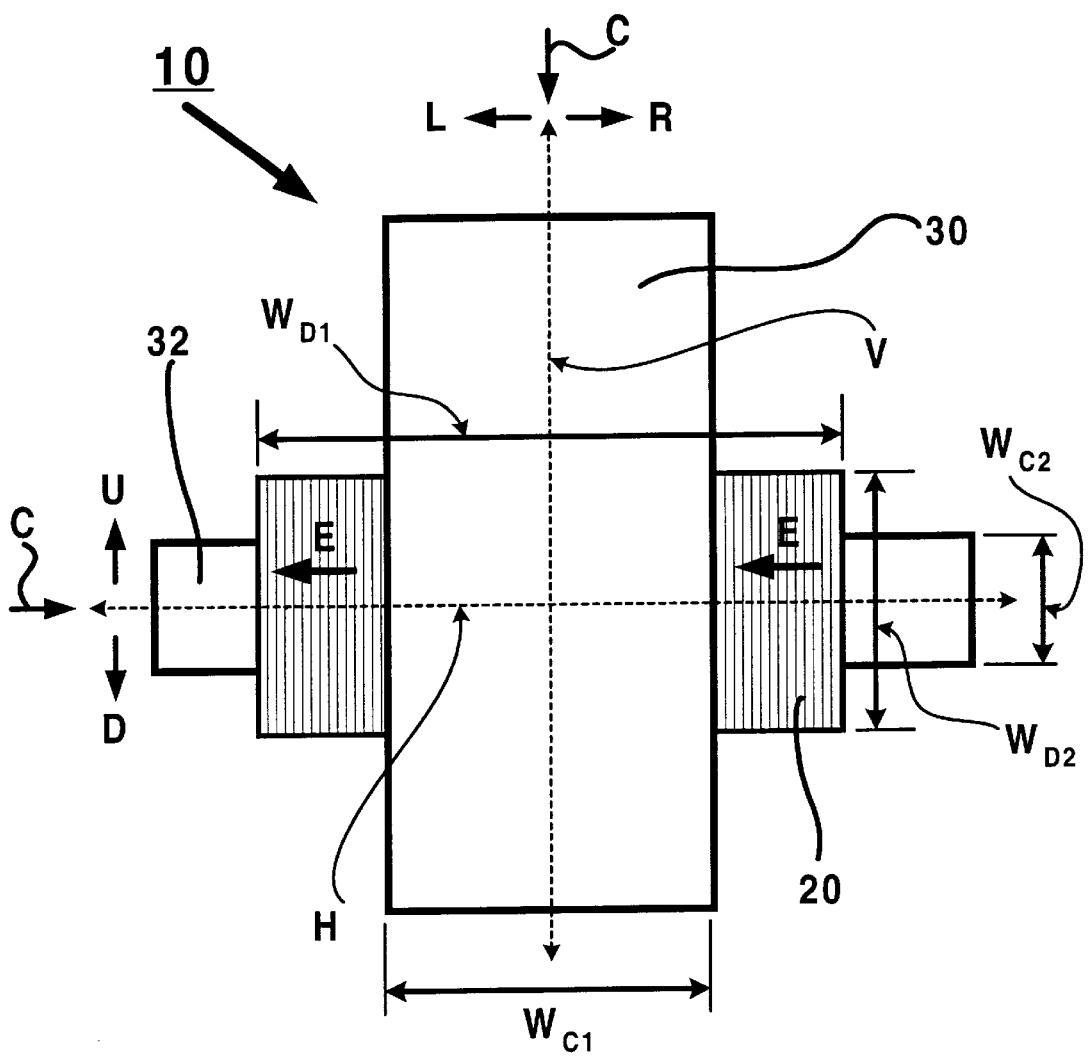
FIGS. 10a through 10c are a top plan view and cross-sectional views of first and second conductors that are narrower than a data storage layer according to the present invention.

Alternatively, the first process alignment offset $\Delta_1$ and the second process alignment offset $\Delta_2$ need not be based on an alignment tolerance of a lithographic process. Instead, the first process alignment offset $\Delta_1$ and the second process alignment offset $\Delta_2$ can be a predetermined value based on a percentage of the first layer width $W_{D1}$ in the first direction V and the second layer width $W_{D2}$ in the second direction H respectively. In one embodiment of the present invention, as illustrated in FIG. 10a, the first conductor 30 is positioned above and the second conductor 32 is positioned below the data storage layer 20. The first direction V and the second direction H can be substantially orthogonal to each other so that the first conductor 30 and the second conductor 32 cross the data storage layer 20 in substantially orthogonal relation to each other. Additionally, as mentioned above, the first conductor 30 can have its first width $W_{C1}$ centered C, left-shifted L, or right-shifted R within the first layer width $W_{D1}$, and the second conductor 32 can have its second width $W_{C2}$ centered C, left-shifted U, or right-shifted D within the second layer width $W_{D2}$.

In another embodiment of the present invention, the first direction V or the second direction H is co-linear with an easy axis E (i.e. a long axis) of the data storage layer 20. In FIG. 10a, the second direction H is co-linear with the easy axis E of the data storage layer 20.

Although the first and second conductors (30, 32) are illustrated as being a discrete segment of a conductor, an MRAM array would include additional data storage layers 20 and the first and second conductors (30, 32) would extend in the first direction V and in the second direction H and would cross those additional data storage layers 20 as will be discussed below in reference to FIG. 11.

Figure 10B:
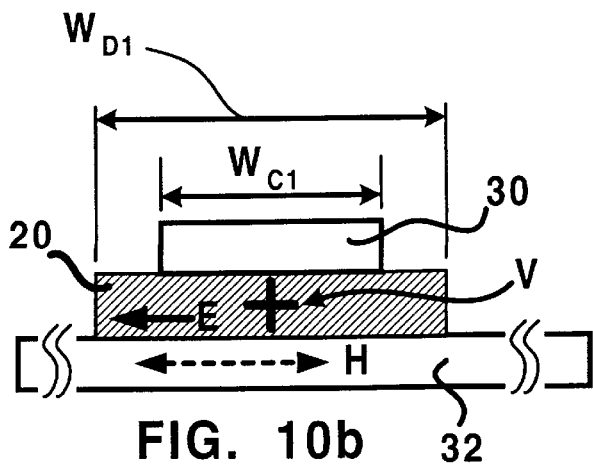
Figure 10C:
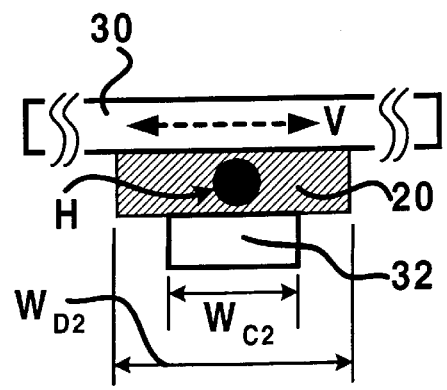

FIG. 10b is a cross-sectional view in the first direction V of the write conductor layout structure 10 of FIG. 10a and illustrates the first width $W_{C1}$ positioned within and overlapped in its entirety by the first layer width $W_{D1}$ of the data storage layer 20. FIG. 10c is a cross-sectional view in the second direction H of the write conductor layout structure 10 of FIG. 10a and illustrates the second width $W_{C2}$ positioned within and overlapped in its entirety by the second layer width $W_{D2}$ of the data storage layer 20.

For purposes of clarity, FIGS. 10b and 10c also illustrate what is meant by the data storage layer 20 having a first layer width $W_{D1}$ in the first direction V and a second layer width $W_{D2}$ in the second direction H. In FIG. 10b, the first direction V is denoted by a + (a cross). The + represents a direction for the first direction V that is into the page. Accordingly, the first layer width $W_{D1}$ is measured in the first direction V and is perpendicular to the first direction V (see FIG. 10a) as illustrated in the cross-sectional view of FIG. 13b. Furthermore, the first width $W_{C1}$ of the first conductor 30 is overlapped in its entirety by the first layer width $W_{D1}$ and the first conductor 30 crosses the data storage layer 20 in the first direction V (see FIG. 10a).

Similarly, in FIG. 10c, the second direction H is denoted by a ● (a dot). The ● represents a direction for the second direction H that is out of the page. Accordingly, the second layer width $W_{D2}$ is measured in the second direction H and is perpendicular to the second direction H (see FIG. 10a) as illustrated in the cross-sectional view of FIG. 13c. Moreover, the second width $W_{C2}$ of the second conductor 32 is overlapped in its entirety by the second layer width $W_{D2}$ and the second conductor 32 crosses the data storage layer 20 in the second direction H (as noted in FIG. 10a).

In one embodiment of the present invention, also illustrated in FIGS. 8a through 8c, the write conductor layout structure 10 includes the first conductor 30 having a first width $W_{C1}$ and the second conductor 32 (not shown) having the second width $W_{C2}$ that is substantially equal to the second layer width $W_{D2}$ ($W_{C2}=W_{D2}$). The first and second conductors (30, 32) cross the data storage layer 20 in substantially the first and second directions (V, H) respectively and the data storage layer 20 is operatively positioned between the first and second conductors (30, 32). The first width $W_{C1}$ of the first conductor 30 is preselected to be less than the first layer width $W_{D1}$ of the data storage layer 20 and the first width $W_{C1}$ is positioned relative to the first layer width $W_{D1}$ so that the first layer width $W_{D1}$ overlaps the entirety of the first width $W_{C1}$.

As mentioned previously, the first width $W_{C1}$ of the first conductor 30 can be preselected to be less than the first layer width $W_{D1}$ of the data storage layer 20 in the first direction V by a first process alignment offset $\Delta_1$. The first process alignment offset $\Delta_1$ can be in a range from about 0.01 µm to about 0.08 µm. The first width $W_{C1}$ can have a position within the first layer width $W_{D1}$ that is a substantially centered position, a left-shifted position, and a right-shifted position (see FIGS. 8a, 8b, and 8c).

In another embodiment of the present invention, the first conductor 30 can be a current carrying bit line or a current carrying word line of a magnetic memory cell. If the first conductor 30 is the bit line, then the second conductor 32 can be the word line or vice versa. Although FIGS. 8a through 8c illustrate the first conductor 30 having a vertical orientation in the first direction V and the second conductor 32 (not shown) having a horizontal orientation in the second direction H, the first conductor 30 can have a horizontal orientation and the second conductor 32 having a vertical orientation.

The data storage layer 20 is adapted to store a bit of data as an orientation of magnetization. The logic value of the bit (i.e. logic "0" or logic "1") is written by rotating the orientation of magnetization from one stable state to another stable state. The orientation of magnetization rotates in response to a write magnetic field generated by currents applied to the first and second conductors (30, 32) crossing the data storage layer 20. The first conductor 30 generates a first portion of the write magnetic field in response to a current applied to the first conductor 30. Similarly, the second conductor 32 generates a second portion of the write magnetic field in response to a current applied to the second conductor 32. The first and second portions of the write magnetic field operate in combination to rotate the orientation of magnetization.

Figure 11:
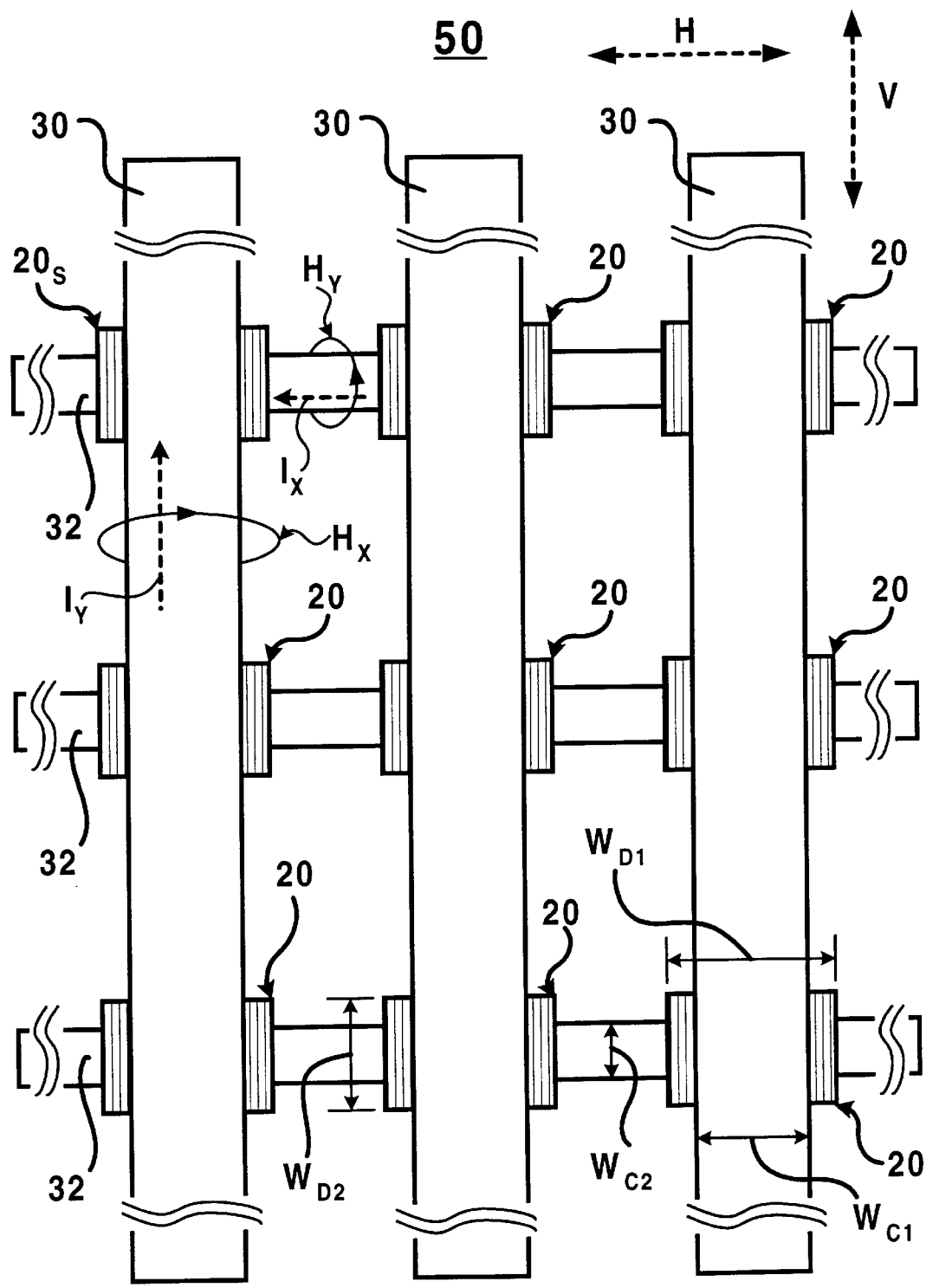
FIG. 11 is a top plan view of a portion of a MRAM memory array incorporating a write conductor layout structure according to the present invention.

In FIG. 11, a plurality of data storage layers 20 are crossed by a plurality of the first and second conductors (30, 32) to form a MRAM array 50. In particular, a data storage layer $20_s$ has been selected for a write operation wherein its orientation of magnetization will be rotated by a first portion of a write magnetic field $H_x$ and a second portion of the write magnetic field $H_y$. The first portion of the write magnetic field $H_x$ is generated by a current $I_y$ applied to the first conduct 30 crossing the data storage layer $20_s$ and the second portion of the write magnetic field $H_y$ is generated by a current $I_x$ applied to the second conductor 32 crossing the data storage layer $20_s$. The first and second portions of the write magnetic field ($H_x$, $H_y$) have vectors determined by the right-hand rule. The currents $I_y$ and $I_x$ can be applied by electronic circuits external to the array 50 and in electrical communication with the first and second conductors (30, 32). Although the first and second portions of the write magnetic field ($H_x$, $H_y$) are generated along the entire length of the first and second conductors (30, 32), it is the combined effect of the first and second portions of the write magnetic field ($H_x$, $H_y$) at the intersection of the first and second conductors (30, 32) with the data storage layer $20_s$ that is operative to rotate the orientation of magnetization of the data storage layer $20_s$.

In one embodiment of the present invention, only the first width $W_{C1}$ of the first conductor 30 is preselected to be less than the first layer width $W_{D1}$ of the data storage layer $20_s$ in the first direction V and the second width $W_{C2}$ of the second conductor 32 is at least as wide as the second layer width $W_{D2}$ in the second direction H. As mentioned previously, the first width $W_{C1}$ is positioned so that it is within the first layer width $W_{D1}$ and so that the first layer width $W_{D1}$ overlaps the entirety of the first width $W_{C1}$. The position of the first width $W_{C1}$ operatively couples the first portion of the write magnetic field $H_x$ with the data storage layer $20_s$. A magnitude of the current $I_y$ applied to the first conductor 30 can be less than when the first width $W_{C1}$ is at least equal to the first layer width $W_{D1}$ ($W_{C1}=W_{D1}$). In essence, narrowing the first width $W_{C1}$ results in a magnitude of the first portion of the write magnetic field $H_x$ being greater for the same applied current $I_y$ and the magnitude of $H_x$ exceeds the minimum magnetic field strength necessary to rotate the orientation of orientation. Consequently, $I_y$ can be reduced and the magnitude of $H_x$ will be sufficient to rotate the orientation of magnetization. Because $I_y$ is reduced, the power consumed by a write operation to the data storage layer $20_s$ is also reduced. The reduction in power consumption also applies to the other data storage layers 20 in the array 50 that are selected for a write operation. As was stated above, reduced power consumption is desirable in portable applications to conserve battery power and in applications in which it is desirable to reduce waste heat.

In another embodiment of the present invention, a further reduction in power consumption can be realized when the second width $W_{C2}$ of the second conductor 32 is preselected to be less than the second layer width $W_{D2}$ of the data storage layer $20_s$ in the second direction H (i.e. both the first and second conductors 30, 32 are narrowed). The second width $W_{C2}$ is positioned so that it is within the second layer width $W_{D2}$ and so that the second layer width $W_{D2}$ overlaps the entirety of the second width $W_{C2}$. The position of the second width $W_{C2}$ operatively couples the second portion of the write magnetic field $H_y$ with the data storage layer $20_s$. For the same reasons given above for the first conductor 30, a magnitude of the current $I_x$ applied to the second conductor 32 can be less than when the second width $W_{C2}$ is at least equal to the second layer width $W_{D2}$ ($W_{C2}=W_{D2}$). The further reduction in power consumption also applies to the other data storage layers 20 in the array 50 that are selected for a write operation.

Figure 4A:
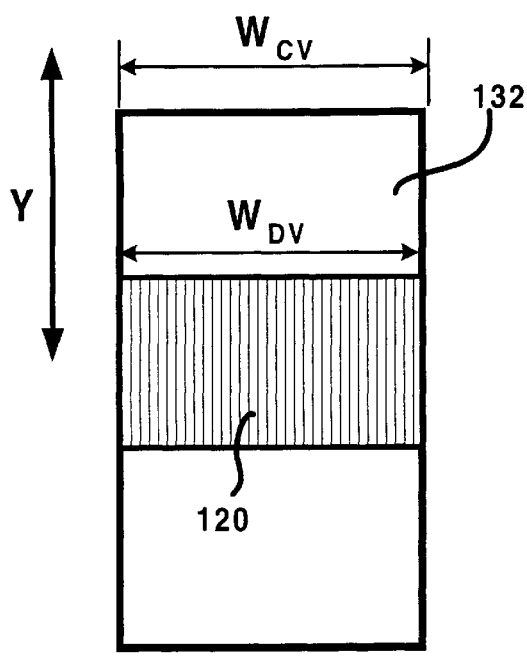
FIGS. 4a and 4b are top plan views of a vertically oriented ideal prior art write conductor and memory cell layout and a misaligned prior art write conductor and memory cell layout respectively.
Figure 4B:
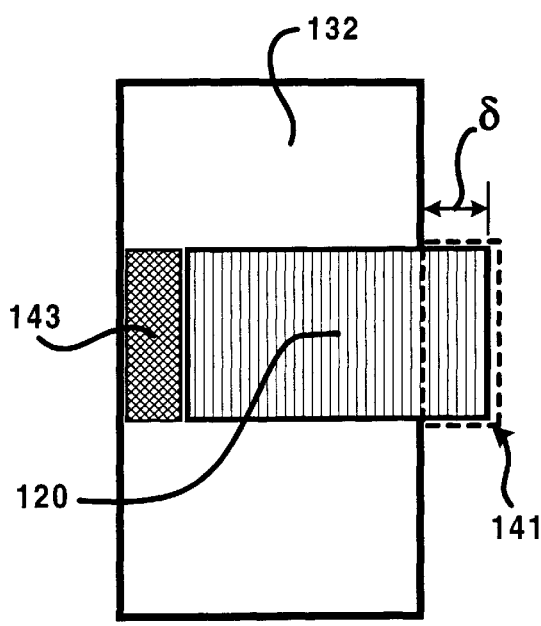
Figure 5A:
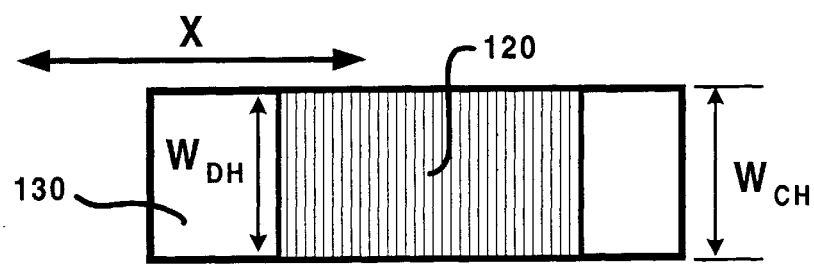
FIGS. 5a and 5b are top plan views of a horizontally oriented ideal prior art write conductor and memory cell layout and a misaligned prior art write conductor and memory cell layout respectively.
Figure 5B:
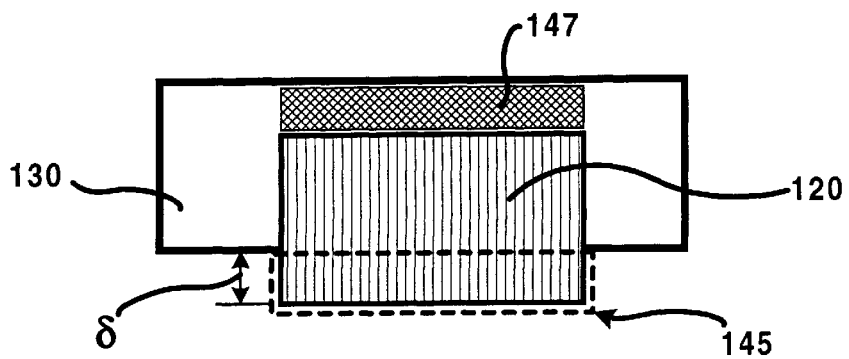
Figure 12:
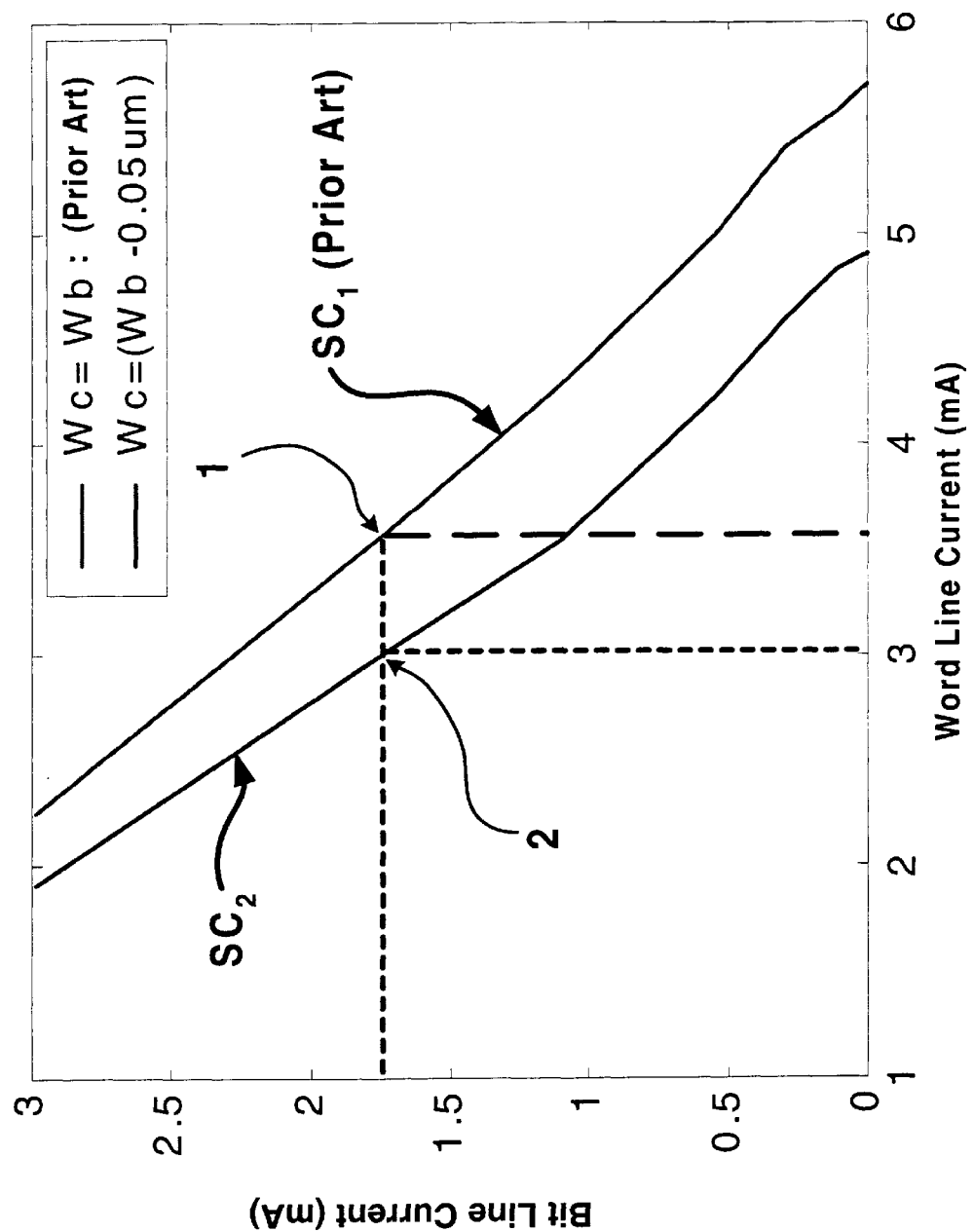
FIG. 12 is a plot of a prior art current switching curve and a current switching curve of a write conductor layout structure of the present invention illustrating a reduction in conductor current resulting from narrowing the width of a write conductor according to the present invention.

FIG. 12 is a plot of a current switching curve $SC_1$ for a prior art magnetic memory cell layout, as described above in reference to FIGS. 4b and 5b, in which the width of a word line $W_c$ and the width of a bit line $W_b$ are equal ($W_c=W_b$). The word line $W_c$ and the bit line $W_b$ cross the magnetic memory cell. Moreover, the word line $W_c$ is offset from the magnetic memory cell by 0.05 $\mu$m to simulate the effects of conductor misalignment on the current switching characteristics of the memory cell. That offset is shown as $\delta$ in FIGS. 4b and 5b. The switching curve $SC_1$ represents values for a magnitude of a bit line current $I_x$ on the y-axis of the plot and a magnitude of a word line current $I_y$ on the x-axis of the plot that are sufficient to rotate the orientation of magnetization $M_1$ in order to write a bit during a write operation to the memory cell. The bit line current $I_x$ generates the magnetic field $H_y$ and the word line current $I_y$ generates the magnetic field $H_x$. For a point 1 on the switching curve $SC_1$, a bit line current $I_x$ of about 1.75 mA and a word line $I_y$ current of about 3.60 mA are required to rotate the orientation of magnetization.

FIG. 12 also illustrates a plot of a current switching curve $SC_2$ for the magnetic memory cell layout 10 of the present invention. For the switching curve $SC_2$, the width of the bit line is the same as the width of the data storage layer (not shown) in the direction that the bit line crosses the data storage layer. However, the word line has a width that is 0.05 $\mu$m less than the width of the data storage layer in the direction that the word line crosses the data storage layer. Moreover, the word line is centrally positioned within the width of the data storage layer and the data storage layer overlaps the entirety of the width of the word line (see FIG. 9a). Accordingly, for a point 2 on the switching curve $SC_2$, a bit line current $I_x$ of about 1.75 mA and a word line current $I_y$ of about 3.00 mA are required to rotate the orientation of magnetization. Therefore, for the same bit line current $I_x=1.75$ mA, the magnetic memory cell layout 10 of the present invention requires about 20% less word line currently than the prior art magnetic memory cell layout (i.e. 3.00 mA vs. 3.60 mA). Resulting is a reduction in power consumption for the magnetic memory cell layout 10 of the present invention. Furthermore, the improvement seen by narrowing the word line can also be duplicated for the bit line, resulting in an even greater reduction in power consumption.

In one embodiment of the present invention, only the first width $W_{C1}$ of the first conductor 30 is preselected to be less than the first layer width $W_{D1}$ of the data storage layer 20 in the first direction V. The second width $W_{C2}$ of the second conductor 32 is at least as wide as the second layer width $W_{D2}$ in the second direction H. The first width $W_{C1}$ is positioned so that it is within the first layer width $W_{D1}$ and so that the first layer width $W_{D1}$ overlaps the entirety of the first width $W_{C1}$. The position of the first width $W_{C1}$ operatively couples the first portion of the write magnetic field $H_x$ with the data storage layer 20. The current $I_y$ applied to the first conductor 30 results in a magnitude of the first portion of the write magnetic field $H_x$ being greater than when the first width $W_{C1}$ is at least equal to the first layer width $W_{D1}$ ($W_{D1}=W_{D1}$). In essence, narrowing the first width $W_{C1}$ results in a magnitude of the first portion of the write magnetic field $H_x$ being greater for the same applied current $I_y$. Consequently, a magnitude of the write magnetic field necessary to rotate the orientation of magnetization of the data storage layer is increased by the contribution from the first portion of the write magnetic field $H_x$.

In another embodiment of the present invention, the magnitude of the write magnetic field is further increased when the second width $W_{C2}$ of the second conductor 32 is preselected to be less than the second layer width $W_{D2}$ of the data storage layer 20 in the second direction H. The second width $W_{C2}$ is positioned so that it is within the second layer width $W_{D2}$ and so that the second layer width $W_{D2}$ overlaps the entirety of the second width $W_{C2}$. The position of the second width $W_{C2}$ operatively couples the second portion of the write magnetic field $H_y$ with the data storage layer 20. For the same reasons given above for the first conductor 30, the current $I_x$ applied to the second conductor 32 results in a magnitude of the second portion of the write magnetic field $H_y$ being greater than when the second width $W_{C2}$ is at least equal to the second layer width $W_{D2}$ ($W_{C2}=W_{D2}$).

In the above mentioned embodiments, the first width $W_{C1}$ of the first conductor 30 can be preselected to be less than the first layer width $W_{D1}$ of the data storage layer 20 in the first direction V by a first process alignment offset $\Delta_1$. Furthermore, the second width $W_{C2}$ of the second conductor 32 can be preselected to be less than the second layer width $W_{D2}$ of the data storage layer 20 in the second direction H by a second process alignment offset $\Delta_2$. The first and second process alignment offsets $\Delta_1$ and $\Delta_2$ can be in a range from about 0.01 $\mu$m to about 0.08 $\mu$m.

For the embodiments described herein, the structure and materials for the data storage layer 20 are well understood by those skilled in the art to which the present invention pertains. However, suitable materials for the active layer (free to rotate its orientation of magnetization) and the reference layer (orientation of magnetization is pinned and is not free to rotate) of the data storage layer 20 include nickel-iron (NiFe), cobalt (Co), $Fe_3O_4$, $CrO_2$, alloys or layers including combinations of those materials, ferromagnetic materials, and ferrimagnetic materials. The active layer and the reference layer can be separated by an one or more layers of dielectric material including aluminum-oxide ($Al_2O_3$), aluminum nitride (AlN), silicon-dioxide ($SiO_2$), and silicon-nitride ($Si_3N_4$). The first and second conductors (30, 32) can be made from an electrically conductive material such as copper or aluminum, for example.

The write conductor layout structure 10 of the present invention has been discussed in relation to its use with a magnetic memory cell; however, the principles of the present invention are not limited to MRAM. The write conductor layout structure 10 also applies to a current carrying conductor that operatively generates a localized magnetic field to switch an orientation of magnetization in a magnetic material.

Although several embodiments of the present invention have been disclosed and illustrated, the invention is not limited to the specific forms or arrangements of parts so described and illustrated. The invention is only limited by the claims.

What is claimed is:

1. A write conductor layout structure for a magnetic memory cell, comprising:
   a first conductor having a first width;
   a second conductor having a second width; and
   a data storage layer operatively positioned between the first and second conductors and having a first layer width in a first direction and a second layer width in a second direction, the first and second conductors crossing the data storage layer in substantially the first and second directions respectively,
   the first width is preselected to be less than the first layer width,
   the second width is preselected to be less than the second layer width,
   wherein the first width is positioned relative to the first layer width so that the first layer width overlaps the entirety of the first width, and
   wherein the second width is positioned relative to the second layer width so that the second layer width overlaps the entirety of the second width.

2. The write conductor layout structure of claim 1, wherein the first width is preselected to be less than the first layer width based on a first process alignment offset and the second width is preselected to be less than the second layer width based on a second process alignment offset.

3. The write conductor layout structure of claim 2, wherein the first process alignment offset and the second process alignment offset are in a range from about 0.01 micrometers to about 0.08 micrometers.

4. The write conductor layout structure of claim 2, wherein the first process alignment offset and the second process alignment offset are equal to each other.

5. The write conductor layout structure of claim 2, wherein the first and second process alignment offsets are determined by an alignment tolerance of a lithographic process.

6. The write conductor layout structure of claim 1, wherein the first and second directions are substantially orthogonal to each other such that the first conductor and the second conductor cross the data storage layer in substantially orthogonal relation to each other.

7. The write conductor layout structure of claim 1, wherein a selected one of the first direction or the second direction is co-linear with an easy axis of the data storage layer.

8. The write conductor layout structure of claim 1, wherein the data storage layer is a magnetoelectric device selected from the group consisting of a spin dependent tunneling device, a spin valve device, and a giant magnetoresistive device.

9. The write conductor layout structure of claim 1, wherein the data storage layer has a shape selected from the group consisting of a rectangular shape, an arcuate shape, and a polygon shape.

10. The write conductor layout structure of claim 1, wherein the first conductor is operatively positioned above the data storage layer and the second conductor is operatively positioned below the data storage layer.

11. The write conductor layout structure of claim 1, wherein any selected one of the first and second widths has a position within its corresponding layer width selected from the group consisting of a substantially centered position, a left-shifted position, and a right-shifted position.

12. A write conductor layout structure for a magnetic memory cell, comprising:
   a first conductor having a first width;
   a second conductor having a second width; and
   a data storage layer operatively positioned between the first and second conductors and having a first layer width in a first direction and a second layer width in a second direction, the first and second conductors crossing the data storage layer in substantially the first and second directions respectively,
   the first width is preselected to be less than the first layer width,
   the second width is substantially equal to the second layer width, and
   wherein the first width is positioned relative to the first layer width so that the first layer width overlaps the entirety of the first width.

13. The write conductor layout structure of claim 12, wherein the first width is preselected to be less than the first layer width based on a first process alignment offset.

14. The write conductor layout structure of claim 13, wherein the first process alignment offset is in a range from about 0.01 micrometers to about 0.08 micrometers.

15. The write conductor layout structure of claim 12, wherein the first conductor is a current carrying line selected from the group consisting of a word line and a bit line.

16. The write conductor layout structure of claim 12, wherein the first width has a position within the first layer width selected from the group consisting of a substantially centered position, a left-shifted position, and a right-shifted position.

17. A write conductor layout structure for a low power magnetic memory cell, comprising:
   a data storage layer having a first layer width in a first direction and a second layer width in a second direction;
   a first conductor for generating a first portion of a write magnetic field in response to a current applied to the first conductor, the first conductor having a first width that is preselected to be less than the first layer width and is positioned relative to the first layer width so that the first layer width overlaps the entirety of the first width; and
   a second conductor for generating a second portion of a write magnetic field in response to a current applied to the second conductor, the second conductor having a second width that is at least equal to the second layer width,
   the data storage layer is operatively positioned between the first and second conductors and the first and second conductors cross the data storage layer in substantially the first and second directions respectively,
   the data storage layer is adapted to store a bit of data as an orientation of magnetization and to rotate the orientation of magnetization in response to the first and second portions of the write magnetic field, and
   wherein the position of the first width operatively couples the first portion of the write magnetic field with the data storage layer so that a magnitude of the current applied to the first conductor is less than when the first width is at least equal to the first layer width.

18. The write conductor layout structure of claim 17, wherein the first width is preselected to be less than the first layer width based on a first process alignment offset.

19. The write conductor layout structure of claim 17, wherein the second width is preselected to be less than the second layer width and is positioned relative to the second layer width so that the second layer width overlaps the entirety of the second width, and wherein the position of the second width operatively couples the second portion of the write magnetic field with the data storage layer so that a magnitude of the current applied to the second conductor is less than when the second width is at least equal to the second layer width.

20. The write conductor layout structure of claim 19, wherein the second width is preselected to be less than the second layer width based on a second process alignment offset.

21. A write conductor layout structure for increasing a write magnetic field in a magnetic memory cell, comprising:

a data storage layer having a first layer width in a first direction and a second layer width in a second direction;

a first conductor for generating a first portion of a write magnetic field in response to a current applied to the first conductor, the first conductor having a first width that is preselected to be less than the first layer width and is positioned relative to the first layer width so that the first layer width overlaps the entirety of the first width; and a second conductor for generating a second portion of a write magnetic field in response to a current applied to the second conductor, the second conductor having a second width that is at least equal to the second layer width, the data storage layer is operatively positioned between the first and second conductors and the first and second conductors cross the data storage layer in substantially the first and second directions respectively, the data storage layer is adapted to store a bit of data as an orientation of magnetization and to rotate the orientation of magnetization in response to the first and second portions of the write magnetic field, and wherein a magnitude of the first portion of the write magnetic field generated by the current applied to the first conductor is greater than when the first width is at least equal to the first layer width.

22. The write conductor layout structure of claim 21, wherein the first width is preselected to be less than the first layer width based on a first process alignment offset.

23. The write conductor layout structure of claim 21, wherein the second width is preselected to be less than the second layer width and is positioned relative to the second layer width so that the second layer width overlaps the entirety of the second width, and wherein a magnitude of the second portion of the write magnetic field generated by the current applied to the second conductor is greater than when the second width is at least equal to the second layer width.

24. The write conductor layout structure of claim 23, wherein the second width is preselected to be less than the second layer width based on a second process alignment offset.

* * * * *